United States Patent
Nam et al.

(10) Patent No.: US 9,225,315 B2
(45) Date of Patent: *Dec. 29, 2015

(54) DIGITAL FILTER HAVING IMPROVED ATTENUATION CHARACTERISTICS

(75) Inventors: Sang-Won Nam, Seoul (KR); Kyoung-Jae Kim, Seoul (KR); Sung-Il Jung, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 615 days.

This patent is subject to a terminal disclaimer.

(21) Appl. No.: 13/581,292

(22) PCT Filed: Feb. 28, 2011

(86) PCT No.: PCT/KR2011/001408
§ 371 (c)(1),
(2), (4) Date: Jan. 10, 2013

(87) PCT Pub. No.: WO2011/105880
PCT Pub. Date: Sep. 1, 2011

(65) Prior Publication Data
US 2013/0110897 A1    May 2, 2013

(30) Foreign Application Priority Data

Feb. 26, 2010  (KR) .................. 10-2010-0018201
Feb. 26, 2010  (KR) .................. 10-2010-0018218
Feb. 26, 2010  (KR) .................. 10-2010-0018219
Jul. 29, 2010  (KR) .................. 10-2010-0073696

(51) Int. Cl.
*G06F 17/10* (2006.01)
*H03H 17/02* (2006.01)

(52) U.S. Cl.
CPC .................. *H03H 17/0294* (2013.01)

(58) Field of Classification Search
None
See application file for complete search history.

(56) References Cited

U.S. PATENT DOCUMENTS

| 8,751,553 | B2 * | 6/2014 | Pajaniradja et al. | 708/300 |
| 8,793,298 | B2 * | 7/2014 | Mathai et al. | 708/316 |
| 2002/0184275 | A1 * | 12/2002 | Dutta et al. | 708/300 |
| 2008/0068667 | A1 | 3/2008 | Tejnil | 358/406 |
| 2012/0314891 | A1 * | 12/2012 | Nam et al. | 381/320 |
| 2013/0110897 | A1 * | 5/2013 | Nam et al. | 708/300 |

* cited by examiner

*Primary Examiner* — David H Malzahn
(74) *Attorney, Agent, or Firm* — TechLaw LLP

(57) ABSTRACT

A digital filter having improved attenuation characteristics is disclosed. The disclosed performs upsampling of model filter response by applying a sampling kernel scaled by a sampling constant. The disclosed filter has good attenuation characteristics with small number of taps and pass bands of the digital filter can be changed with simple parameter variation.

12 Claims, 4 Drawing Sheets

DIGITAL FILTER HAVING IMPROVED ATTENUATION CHARACTERISTICS

TECHNICAL FIELD

The present invention relates to a digital filter, more particularly relates to an improvement of attenuation characteristics of a digital filter.

BACKGROUND ART

A digital filter is integrated, miniaturized and manufactured with low cost and high reliability, and so have much advantage compared with an analog filter. Specially, application field of the digital filter has been increased according as communication velocity is realized with high speed and an amount of communication is augmented, and the digital filter has been employed in devices such as a transmitter and a receiver of a baseband module in a mobile communication system.

The digital filter is generally divided into a finite impulse response filter and an infinite impulse response filter.

The finite impulse response filter uses characteristic that impulse response has a finite length when the impulse response is inputted to the filter. This is because the finite impulse response filter does not use any feedback.

The finite impulse response filter not using the feedback does not need feedback loop, and thus stability of the filter is guaranteed. Specially, since the finite impulse response filter satisfies linear phase characteristic, the finite impulse response filter has been widely used in applications such as waveform transmission, etc. However, in case that the finite impulse response filter will realize approximately the same amplitude as the infinite impulse response filter, order of the finite impulse response filter is more increased. As a result, the finite impulse response filter is more loaded in view of hardware including an adder and a multiplier.

The finite impulse response filter may be designed through a design method in a frequency domain and a design method in a time domain, and a window function method and a frequency sampling method, etc. are mainly used when the finite impulse response filter is designed through the design method in the frequency domain.

The design of the filter in the time domain is simpler than that in the frequency domain because impulse response in the design of the filter in the time domain corresponds to coefficients of the filter. A linear programming is widely known as a method of approximating a transfer function, and an optimal solution may be calculated through finite calculation in case that the optimal solution exists.

Specially, output finitude of the finite impulse response filter allows to omit a calculation process of not generating decimated output or a calculation process of generating a predictable value in an interpolated output, and thus this is calculatedly efficient when performing interpolation or decimation so as to increase or reduce multirate application, e.g. sampling rate of a signal.

Filter Attenuation Characteristics is associated with filter response transition between pass band and stop band. Ideally, the steeper is the filter attenuation characteristics, the better is the filter characteristics. The filter attenuation characteristics is in trade-off relation with the number of taps of the filter.

In order words, in order for better attenuation characteristics, more taps are required. As the number of taps greatly affect manufacturing cost of the filter, filter implementation cost becomes more expensive if better attenuation characteristics is to be obtained.

Further, in conventional digital filters, filter coefficients and the number of taps of the filter are fixed, therefore, it was impossible to adjust pass band adaptively.

DISCLOSURE

Technical Problem

The present invention provides a digital filter having good attenuation characteristics with small number of taps.

Further, the present invention provides a digital filter of which the pass band can be changed with simple parameter variation, the digital filter having good attenuation characteristics with small number of taps.

Technical Solution

In one aspect, the present invention provides a digital filter having improved attenuation characteristics which performs upsampling of model filter response by applying a sampling kernel scaled by a sampling constant.

It is preferable that the sampling kernel is scaled by the sampling constant using a sinc function.

The sampling kernel using the sinc function is expressed as following equation,.

$$K_\alpha(n, k) = \mathrm{sinc}\left(\frac{n}{\alpha} - k\right)$$

here, $\alpha$ is the sampling constant, and $K_\alpha(n,k)$ is the sampling kernel.

The upsampling is performed by following equation.

$$h_{(\alpha)}[n] = \frac{1}{\alpha} h_\alpha[n] = \sum_{k=0}^{N-1} h[k] \cdot \frac{1}{\alpha} K_\alpha(n, k)$$

here, $K_\alpha(n,k)$ is the sampling kernel, and $h[n]$ is the model filter response.

The sampling constant is determined by following equation, $$\alpha_{opt} = \frac{2\pi}{\omega_p + \omega_s + \sqrt{2\pi(\omega_s - \omega_p)}}$$

here, $\omega_p$ is frequency of pass band, and $\omega_s$ is frequency of stop band.

In another aspect, the present invention provides a digital filter having improved attenuation characteristics comprising: a delay section for delaying an input signal based on an sampling constant; and a filtering section for filtering an output signal of the delay section, wherein, response of the delay section and the filtering section is set so that an upsampling of filter response for the filtering section is performed by a sampling kernel scaled by a sampling constant.

In still another aspect, the present invention provides a frequency reconfigurable digital filter comprising: a sampling kernel storage section configured to store a sampling kernel for performing upsampling of a model filter response scaled by a sampling constant and generating response of Multi images which are repeatedly formed with a constant period; a complementary conversion section configured to generate response of Multi complementary images repeatedly formed with constant period in frequency domain where the Multi images are not generated, the Multi complimentary images having the same characteristic as the Multi images; and an image response operation section configured to operate response of an image corresponding to a selected band among the Multi complementary images and the Multi images.

Advantageous Effects

The digital filter of the present invention has good attenuation characteristics with small number of taps and pass bands of the digital filter can be changed with simple parameter variation.

BEST MODE FOR CARRYING OUT THE INVENTION

Figure 1:
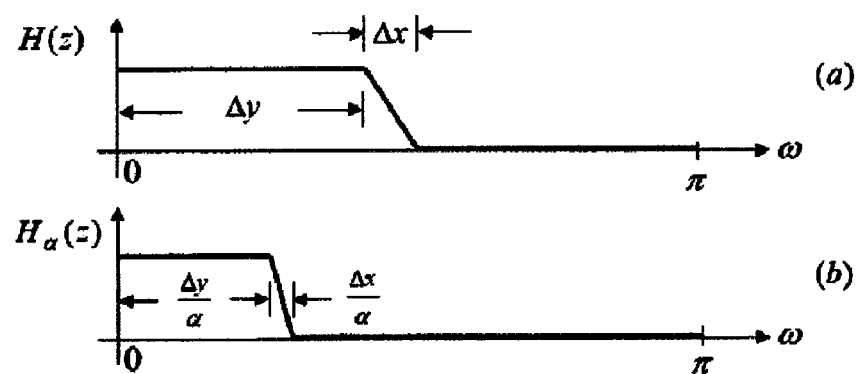
FIG. 1 is a view illustrating change of response of a model filter when the upsampling is performed according to one example embodiment of the present invention.

Hereinafter, embodiments of the present invention will be described in detail with reference to accompanying drawings. The same reference numbers will be used to refer to the same or like elements, and repeated description of the same or like elements will be omitted.

(1) Upsampling

In the present invention, the "upsampling" means process for applying sampling kernel to a model filter in order to enhance attenuation characteristics of a model filter. The model filter designed to have specific filtering characteristics may be realized with hardware or software.

The upsampling in the present invention is performed for enhancing attenuation characteristic corresponding to a slope of a pass band of the filter, and in addition bandwidth may be adjusted through the upsampling.

To design the filter having excellent attenuation characteristics (to have high slope in the transition band) is a method of designing ideal filter, but many coefficients should be used for designing the filter so as to enhance the attenuation characteristics. This means that large numbers of taps are required for the filter.

As the number of the taps of the filter increases, cost and size of the filter are augmented when the filter is manufactured as a hardware, and much amount of calculation is needed when the filter is designed as a software. The attenuation characteristics and the number of the tap are in trade off relation.

The present invention performs the upsampling of the model filter function having comparably small number of the taps to enhance the attenuation characteristics, and adjusts the bandwidth of the model filter when needed.

In one embodiment of the present invention, the upsampling is performed by using sampling kernel scaled by sampling constant $\alpha$.

The sampling kernel is defined as $K_\alpha(n,k)$, and $\alpha$ is defined as the sampling constant. In case that response of the finite impulse response model filter having length N is h[n], the upsampling scaled by the sampling constant of the present invention may be performed as shown in following Equation 1.

$$h_{(\alpha)}[n] = \frac{1}{\alpha} h_\alpha[n] = \sum_{k=0}^{N-1} h[k] \cdot \frac{1}{\alpha} K_\alpha(n, k) \quad \text{[Equation 1]}$$

In the Equation 1, $h_{(\alpha)}[n]$ is the response of the filter having finally good attenuation characteristics by the upsampling.

On the other hand, the sampling kernel in the Equation 1 may have various types. The sampling kernel may use Sinc function as one of most ideal cases, but function used in the sampling kernel is not limited to Sinc function. It will be obvious to those skilled in the art that various types of functions are used as the sampling kernel.

For example, the sampling kernel may have various types of adjustable widow functions such as Sinc function shown in following Equation 2, and various functions including Sinc function may be used as the sampling kernel.

$$K_\alpha(n, k) = \operatorname{sinc}\left(\frac{n}{\alpha} - k\right) \quad \text{[Equation 2]}$$

$$K_\alpha(n, k) = \frac{\sin\pi\left(\frac{n}{\alpha} - k\right)}{\pi\left(\frac{n}{\alpha} - k\right)} \frac{\cos\pi R\left(\frac{n}{\alpha} - k\right)}{1 - 4R^2\left(\frac{n}{\alpha} - k\right)}$$

$$K_\alpha(n, k) = \frac{I_0\left\{\beta\sqrt{1 - \left[\left(\frac{n}{\alpha} - k\right)/M\right]^2}\right\}}{I_0(\beta)}$$

$$K_\alpha(n, k) = \frac{\cos\left\{M\cos^{-1}\left[\lambda\cos\left(\frac{\pi}{M}\left(\frac{n}{\alpha} - k\right)\right)\right]\right\}}{\cosh[M\cosh^{-1}(\lambda)]}$$

In the Equation 2, the second Equation uses raised-cosine, and R means roll-off constant and is a reference of determining the bandwidth of the filter. In the Equation 2, the third Equation uses Kaiser, $I_0$ means zeroth order modified Bessel function of the first kine, $\beta$ indicates real number for determining shape of a window, and M means length of sequence.

The fourth Equation uses Dolph-Chebychev, and $\lambda$ is a parameter adjustable side-lobe.

FIG. 1 is a view illustrating change of response of a model filter when the upsampling is performed according to one example embodiment of the present invention.

In FIG. 1, (a) shows response of the model filter before performing the upsampling, and (b) illustrates response of the model filter after the upsampling is performed.

Referring to FIG. 1, transition slope between a pass band and a stop band after the upsampling is performed becomes sharp compared with that of the model filter function before upsampling, and thus the attenuation characteristics is enhanced.

In case that the sampling constant α in the Equation 1 is an integer, the Equation 1 may be expressed as convolution type shown in following Equation 3. That is, the upsampling is performed by simple convolution operation, and thus the amount of calculation may be reduced compared with the conventional filter design.

$$h_{(\alpha)}[n] = \frac{1}{\alpha}\sum_{k=0}^{N-1} h[k]\mathrm{sinc}\left(\frac{n}{\alpha} - k\right)$$

$$= \frac{1}{\alpha}\sum_{k=0}^{N-1} h[k]\mathrm{sinc}\left[\frac{1}{\alpha}(n - \alpha k)\right]$$

$$= \frac{1}{\alpha} h_{up}[n] * \mathrm{sinc}\left(\frac{n}{\alpha}\right)$$

[Equation 3]

In the upsampling of the present invention, $h_{up}[n]$ is obtained by inserting (α-1) number of 0 between adjacent coefficients of the filter h[n]. Since real operation in the Equation 3 is performed by only coefficient of h[n], sampling rate or amount of calculation is not increased.

Optimal sampling constant α may be calculated so that the filter has optimal amount of calculation. Following Equation 4 is one example of calculating the optimal sampling constant, $\omega_p$ means frequency of the pass band, and $\omega_s$ indicates frequency of the stop band. In case that α is determined as an integer approximate to the sampling constant obtained by the Equation 4, it is most efficient in view of total calculation.

$$\alpha_{opt} = \frac{2\pi}{\omega_p + \omega_s + \sqrt{2\pi(\omega_s - \omega_p)}}$$

[Equation 4]

Figure 2:
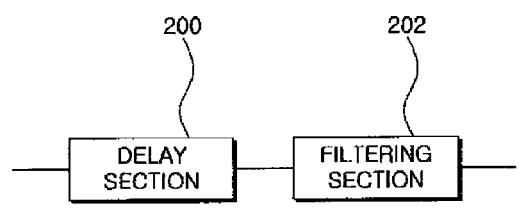
FIG. 2 is a block diagram of a digital filter device according to a first embodiment of the present invention.

(2) Example of Filter Configuration having Improved Attenuation Characteristics using Delay FIG. 2 is a block diagram of a digital filter device according to a first embodiment of the present invention.

Referring to FIG. 2 the digital filter device of the first embodiment of the present invention comprises a delay section 200 and filtering section 202.

The delay section 200 delays input signal inputted to the filter by predetermined time interval. The delay section 200 and filtering section 202 operate as an upsampling modul for enhancing filter attenuation characteristics, and the delay section 200 delays input signal in accordance with sampling constant α set for upsampling.

Delay of input signal in delay section 200 according to sampling constant α causes same effect as the effect by interpolation inserting 0 to input signal corresponding to sampling constant.

The sampling constant α can be determined to have optimal calculation amount. For example, the sampling constant α can be determined by above Equation 4.

Alternatively, the sampling constant α can be determined regardless of optimal equation. At this case, the sampling constant α can be determined in accordance with desired attenuation characteristics.

The filtering section 202 performs filtering for output signal of the delay section. The filtering section 202 comprises a plurality of delay elements and adding elements like general filter chip and performs filtering for input signal.

As described above, in case the input signal is delayed corresponding to the sampling constant and filtering is performed, same effect can be caused substantially as the effect of the interpolation. Filter response $h_{up}[n]$ used in the delay unit and the filter unit can be expressed as following Equation 5.

$$h_{up}[n] = \begin{cases} h[n/\alpha], & n = 0, \pm\alpha, \pm 2\alpha, \ldots, \\ 0, & \text{otherwise.} \end{cases}$$

[Equation 5]

Figure 3:
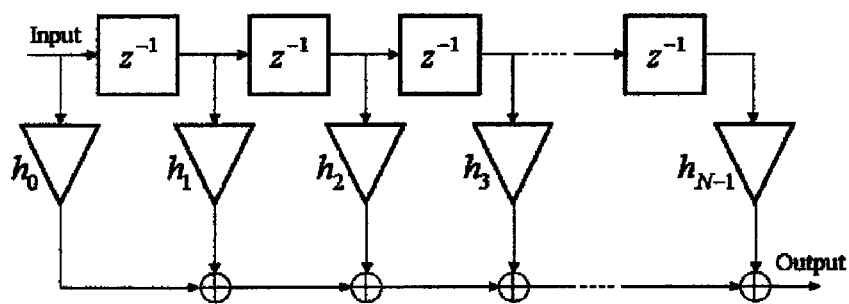
FIG. 3 illustrates an internal constitution of general filters.
Figure 6:
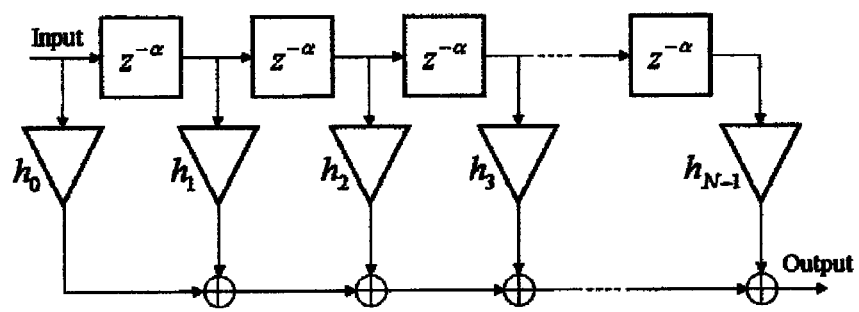
FIG. 6 illustrates conceptual module of a filter which performs upsampling through the delay section and filtering section.

FIG. 3 illustrates an internal constitution of general filters and FIG. 6 illustrates conceptual module of a filter which performs upsampling through the delay unit and filter unit.

Referring to FIG. 3, the general filter includes a plurality of delay elements($z^{-1}$) and a plurality of coefficients (h0, h1, h2 . . . ) for filter are set.

According to the present invention which performs upsampling by inserting 0 corresponding to sampling constant α, filter response is substantially identical to the equation 5.

In case upsampling is used, it is possible to obtain better attenuation characteristics with small number of taps in filter unit. For example, when the number of taps are fixed at N, attenuation characteristics of the present invention is identical to that of the general filters having α N taps.

The upsampling shown in FIG. 2 is one example of application of sampling kernel proposed by the present invention. The upsampling can also be performed through software calculation of sampling kernel of the equation 1 and equation 2 and filter characteristics with enhanced attenuation can be obtained.

(3) Multi Image and Multi Complementary Image

The filter of the present invention generates a plurality of images about the response of the filter after the upsampling is performed in order to enable selecting various pass bands. "Image" used in the present invention means an object forming specific pass band in a frequency domain graph of the filter and may also be interpreted as "specific pass band".

Response of the model filter has generally filtering response of baseband, and thus the response of the model filter after the upsampling has only one image in low frequency band.

The present invention converts the response of the upsampled model filter to have plural images. This means that the response of the filter has plural pass bands through the conversion. In the present invention, images generated by converting upsampled model filter response is referred to as "Multi image".

The Multi images are generated on the basis of the image of the baseband, and the Multi images (pass bands) have the same characteristic as the image of the baseband. In other words, in case that bandwidth, attenuation characteristic and size of the image of a low pass band are respectively W, C, and A, the Multi images may have also bandwidth W, attenuation characteristic C, and size A. That is, shape of the first Multi image is same as that of second Multi image and third Multi image.

The Multi images generated based on the image of the base band may have constant period. Here, the period is associated with bandwidth of the image of the base band.

For example, in case that the image of the base band has the bandwidth 2 W between −W and W, the Multi images are repeatedly formed with period of 2 W and type of each Multi image is same as the image of the base band.

Accordingly, in case that the image of the base band having the bandwidth 2 W between −W and W exists, the Multi images are generated through a method of generating a second Multi image in a band between 3 W and 5 W and generating a third Multi image in a band between 7 W and 9 W.

Figure 7:
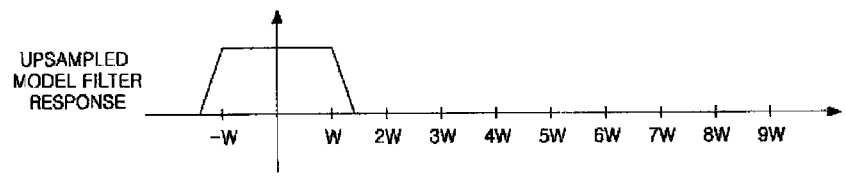
FIG. 7 is a view illustrating Multi images and Multi complementary images according to one example embodiment of the present invention.
Figure 7:
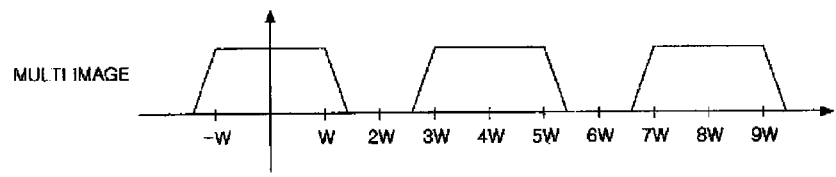
Figure 7:
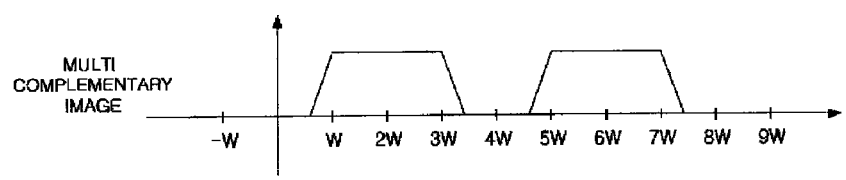

FIG. 7 is a view illustrating Multi images and Multi complementary images according to one example embodiment of the present invention.

In FIG. 7, (a) shows the response of the Equation 1 in the frequency domain, and (b) illustrates the Multi image of the response (a). As shown in FIG. 7, the same images are repeatedly formed with constant period.

The Multi images of the base band response of the model filter after the upsampling may be generated through IDTFT (Inverse Discrete-Time Fourier Transform) conversion, and IDTFT conversion for the response of the model filter can be expressed as following Equation 6.

$$h_{(\alpha)}[n] = \frac{1}{2\pi} \sum_{k=0}^{N-1} h[k] \int_{-\frac{\pi}{\alpha}}^{\frac{\pi}{\alpha}} e^{j(n-\alpha k)w'} dw' \quad \text{[Equation 6]}$$

In the Equation 6, response of model filter h[n] having one image is converted to have Multi images. In case that L is the number of the image (image number), response $h_{(\alpha),L}[n]$ of the filter having plural Multi images generated through the IDTFT conversion may be expressed as following Equation 7.

$$h_{(\alpha),L}[n] = \frac{1}{2\pi} \sum_{k=0}^{N-1} h[k] \int_{-\frac{(2L+1)\pi}{\alpha}}^{\frac{(2L+1)\pi}{\alpha}} e^{j(n-\alpha k)w'} dw' \quad \text{[Equation 7]}$$

$$= \sum_{k=0}^{N-1} h[k] \cdot \frac{1}{\alpha} K_{\alpha,L}(n, k)$$

In the Equation 7, in case that Sinc function is applied to the sampling kernel $K_{\alpha,L}(n,k)$, the sampling kernel may be expressed as following Equation 8.

$$K_{\alpha,L}(n, k) = (2L+1)\text{sinc}\left(\left(\frac{n}{\alpha} - k\right)(2L+1)\right) \quad \text{[Equation 8]}$$

In the Equations 7 and 8, the Multi images are not generated in case that L is 0, and the Multi images corresponding to an integer L are generated in case that the L is not 0.

The Equation 7 may be expressed as frequency response shown in following Equation 9.

$$H_{(\alpha),L}[e^{j\omega}] = \quad \text{[Equation 9]}$$

$$\begin{cases} H[e^{j\alpha\omega}], & w \in \left[-\frac{(2L+1)\pi}{\alpha}, \frac{(2L+1)\pi}{\alpha}\right] \\ 0, & w \in \left[-\pi, -\frac{\pi(2L+1)}{\alpha}\right) \cup \left(\frac{\pi(2L+1)}{\alpha}, \pi\right] \end{cases}$$

As described above, shape of the Multi images is identical to that of the response of the upsampled model filter, and period of the Multi images corresponds to bandwidth of the response of the upsampled model filter.

Upsampling and generation of plurality of Multi images can be performed together by applying sampling kernel of Equation 7 and Equation 8. It should be noted that the sampling kernel of Equation 1 and Equation 2 for only improving attenuation characteristics is different from the sampling kernel of Equation 7 and Equation 8 for upsampling and generation of Multi images. By applying sampling kernel of Equation 7 and Equation 8, improvement of attenuation characteristics and generation of Multi images can be performed together.

Figure 8:
FIG. 8 is a view illustrating change of the Multi image in accordance with change of L according to one example embodiment of the present invention.

FIG. 8 is a view illustrating change of the Multi image in accordance with change of L according to one example embodiment of the present invention.

Referring to FIG. 8, the number of the generated Multi images may be adjusted by changing the image number L which is a parameter of the sampling kernel.

As shown in FIG. 8, one additional Multi image is generated in case that the L is 1, and three additional Multi images are generated in case that the L is 3. Here, L may be selected by a user.

In one embodiment of the present invention, a plurality of complementary images are generated in frequency domain where Multi images are not formed.

That is, the Multi complementary images are formed between W and 3 W and between 5 W and 7 W where the Multi images are not formed.

The Multi complementary images have also the same characteristics as the base band image of the model filter, and the Multi complementary images are repeatedly formed with period of base band image bandwidth of the model filter.

The Multi complementary image may be obtained by delaying the response of the model filter by $$z^{-\frac{(N-1)}{2}}$$

in z domain, and this may be expressed as following Equation 10. Here, N is a length of the model filter.

$$H^c(z) = z^{-\frac{(N-1)}{2}} - H(z) \quad \text{[Equation 10]}$$

$$H^c_{(\alpha),L}(z) = z^{-\frac{(N-1)\alpha}{2}} - H_{(\alpha),L}(z)$$

Finally, the Multi complementary images may be calculated through following

Equation 10, and the number of the Multi complementary images may be also determined by L.

$$h^c_{(\alpha),L}[n] = \frac{1}{2\pi} \sum_{k=0}^{N-1} h^c[k] \int_{-\frac{(2L)\pi}{\alpha}}^{\frac{(2L)\pi}{\alpha}} e^{j(n-\alpha k)w'} dw' \quad \text{[Equation 11]}$$

$$= \sum_{k=0}^{N-1} h^c[k] \cdot \frac{1}{\alpha} K^c_{\alpha,L}(n, k)$$

In Equation 11, in case that Sinc function is applied to the sampling kernel for the Multi complementary images, the sampling kernel may be expressed as following Equation 12.

$$K_{a,L}^c(n, k) = (2L)\text{sinc}\left(\left(\frac{n}{\alpha} - k\right)(2L)\right)$$ [Equation 12]

The Equation 11 may be expressed as frequency response shown in following Equation 13.

$$H_{(\alpha),L}^c[e^{j\omega}] = \begin{cases} H[e^{j\alpha\omega}], & w \in \left[-\frac{(2L)\pi}{\alpha}, \frac{(2L)\pi}{\alpha}\right] \\ 0, & w \in \left[-\pi, -\frac{\pi(2L)}{\alpha}\right) \cup \left[\frac{\pi(2L)}{\alpha}, \pi\right] \end{cases}$$

The number of the Multi complementary images may also be adjusted by changing the image number L.

Figure 9:
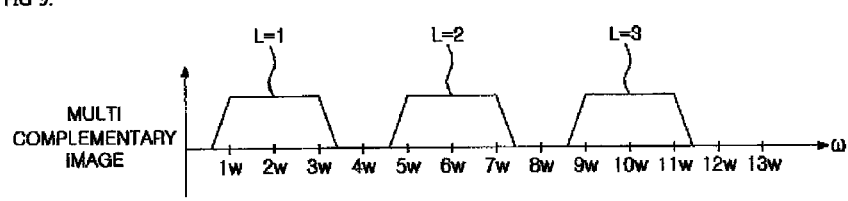
FIG. 9 is a view illustrating change of the Multi complementary images in accordance with change of L according to one example embodiment of the present invention.

FIG. 9 is a view illustrating change of the Multi complementary images in accordance with change of L according to one example embodiment of the present invention.

Referring to FIG. 9, it is verified that the Multi complementary image is not generated in case that the L is 0, and the Multi complementary images are generated by the same number as the L.

(4) Operation of Image Response

When the Multi images and the Multi complementary images are generated through the Equations 7 and 11, a process of operating response of a desired pass band by selecting images corresponding to the desired pass band is performed.

In case that a Multi image or a Multi complementary image corresponding to the desired pass band is selected, response of the selected image is operated.

Figure 5:
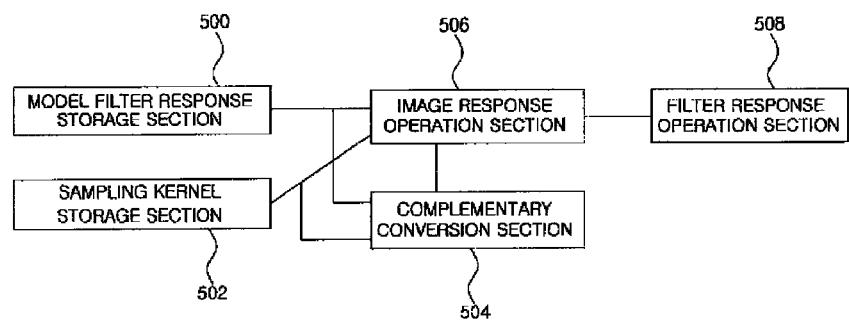
FIG. 5 is a block diagram illustrating a frequency reconfigurable digital filter according to a second embodiment of the present invention.

For example, in case that a band pass filter having band of 7 W to 9 W is needed, response of the second Multi image is operated because the band is identical to that of the second Multi image in FIG. 5.

Response of selected Nth Multi image may be calculated by subtracting response obtained by substituting (N−1) for L in the Equation 7 from response obtained by substituting N for L in the Equation 7. The response of the filter about the second Multi image in the above example may be calculated by subtracting equation obtained by substituting 1 for L in the Equation 7 from equation obtained by substituting 2 for L in the Equation 7.

Response of the filter corresponding to an Lth image may be expressed as following Equation 14.

$$hb_{(\alpha),L}[n] = h_{(\alpha),L}[n] - h_{(\alpha),L-1}[n]$$ [Equation 14]

The above method of operating the response is applied in the same manner to a process of operating response of specific Multi complementary image.

Response of an Lth Multi complementary image may be calculated by subtracting response obtained by substituting (L−1) in the Equation 10 from response obtained by substituting L in the Equation 11, and may be expressed as following Equation 15.

$$hb_{(\alpha),L}^c[n] = h_{(\alpha),L}^c[n] - h_{(\alpha),L-1}^c[n]$$ [Equation 15]

(4) Final Response of the Filter

The present invention generates final response of the filter by summing the selected Multi image responses or Multi complimentary image responses. In case that wide-band filter response or Multi-band filter response is necessary, plural Multi images or Multi complementary images are selected, and final filter response is obtained by summing each of the selected image responses or complimentary image responses.

For example, in case that a band pass filter having multi band corresponding to a second Multi image and a third Multi image is required, the final response of the filter may be obtained by summing response of the second Multi image and response of the third Multi image.

Constitution of the Filter (1) First Embodiment

Figure 4:
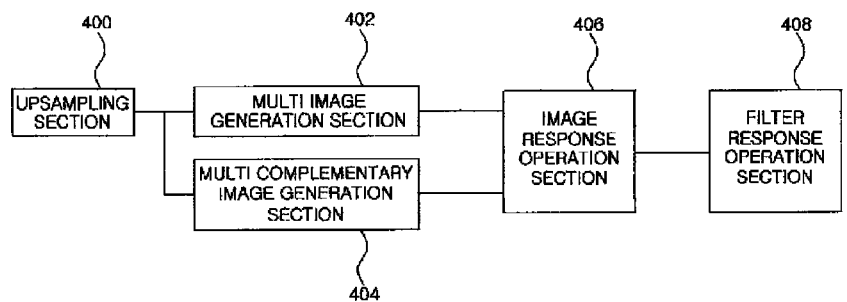
FIG. 4 is a block diagram illustrating a frequency reconfigurable digital filter according to a first example embodiment of the present invention.

FIG. 4 is a block diagram illustrating a frequency reconfigurable digital filter according to a first example embodiment of the present invention.

In FIG. 4, the frequency reconfigurable digital filter of the present embodiment includes an upsampling section 400, a Multi image generation section 402, a Multi complementary image generation section 404, an image response operation section 406 and a filter response operation section 408.

The upsampling section 400 applies the sampling kernel scaled by the sampling constant to the model filter, thereby enhancing characteristics of the model filter. The upsampling about the model filter may be performed by multiplying the model filter function by the sampling kernel scaled by the sampling constant α as shown in the Equation 1, and attenuation characteristic and bandwidth of the model filter are changed in accordance with the sampling constant α. α may be properly selected in accordance with desired bandwidth and attenuation characteristic.

The Multi image generation section 402 generates the response of the Multi image corresponding to the pass bands on the basis of the response of the upsampled model filter, and the Multi complementary image generation section 404 generates the response of the Multi complementary images in the frequency area where Multi images are not formed.

As described above, the Multi image and the Multi complementary image have the same characteristic as the response of the upsampled model filter, and form pass bands in different frequency area, respectively.

The Multi images can be generated by converting the model filter response through Equation 6, and the Multi complementary images can be generated through Equation 9 or Equation 10.

It is described above that the upsampling and the process of generating the Multi image and the Multi complementary image are performed in sequence in the first embodiment. However, it will be obvious to those skilled in the art that response for upsampling and generating Multi image or Multi complimentary images can be obtained at one time through the equation 6, equation 9 or equation 10.

The image response operation section 406 operates the response of the select Multi image or complementary image. In case that specific pass band is selected, the image response operation section 406 operates the response about each of the selected images.

As described above, the response about the image is calculated by subtracting the response to generate (L−1) Multi images from the response to generate L Multi images. The response of the Multi image and the response of the Multi complementary image are as same as the Equation 13 and the Equation 14, respectively.

The filter response operation section 408 operates the final response of the filter by summing the response of each of the selected images, and thereby close-form response for frequency reconfigured filter can be obtained. In case that only one image is selected, response of the image becomes the final response of the filter, and additional summing process is not required.

(2) Second Embodiment

FIG. 5 is a block diagram illustrating a frequency reconfigurable digital filter according to a second embodiment of the present invention.

The second embodiment shows constitution of the filter as a module in case that the filter is realized with software, and illustrates the filter in the first embodiment as the block diagram in other point of view.

In FIG. 5, the frequency reconfigurable digital filter of the second embodiment includes a model filter response storage section 500, a sampling kernel storage section 502, a complementary conversion section 504, an image response operation section 506 and a filter response operation section 508.

The model filter response storage section 500 stores the response of the model filter having specific number of tap and coefficient.

The sampling kernel storage section 502 stores the sampling kernel scaled by the sampling constant for upsampling and the generation of the Multi images. The sampling kernel has image number L as variable. In case that Sinc function is applied to the sampling kernel, the sampling kernel shown in the Equation 7 is stored in the sampling kernel storage section 502. Various sampling kernels other than Sinc function may be used as shown in the Equation 2.

The complementary conversion section 504 performs complimentary conversion for generation of the Multi complementary images. The complementary conversion may be performed through conversion expression shown in the Equation 9. Alternatively, the response of the model filter and the sampling kernel for the complementary image are stored separately, and the Multi complementary image may be generated by using the response and the sampling kernel.

The image response operation section 506 operates response of the image corresponding to the selected pass band. In case that the Multi image is selected, the image response operation section 506 operates the response corresponding to the selected image through a method shown in the Equations 6 and 13 by using the stored response of the model filter and the sampling kernel which uses sampling constant and the image number as variable.

In case that specific complementary image among the Multi complementary images is selected, the image response operation section 506 operates the response corresponding to the selected Multi complementary image through a method shown in the Equations 10 and 14 by using the stored response of the model filter, the sampling kernel which uses sampling constant and the image number as variable and the complementary conversion.

The filter response operation section 508 operates final response of the filter by summing the response of each of the selected images, and calculates with closed-form shape the response of the filter of which frequency is reconfigured through the above operation. In case that only one image is selected, response of the image becomes the final response of the filter, and extra summing process is not required.

Although embodiments have been described with reference to a number of illustrative embodiments thereof, it should be understood that numerous other modifications and embodiments can be devised by those skilled in the art that will fall within the spirit and scope of the principles of this disclosure.

The invention claimed is:

1. A digital filter having improved attenuation characteristics, comprising:
   an upsampling section for performing upsampling of model filter response for enhancing attenuation characteristics of the model filter by applying a sampling kernel scaled by a sampling constant, and
   a filtering section for filtering an output signal of the upsampling section;
   wherein, the sampling kernel is scaled by the sampling constant using a sinc function,
   and wherein, the sampling kernel using the sinc function is expressed as the following equation, $$K_\alpha(n, k) = \mathrm{sinc}\left(\frac{n}{\alpha} - k\right)$$

and, wherein the upsampling is performed by the following equation, $$h_{(\alpha)}[n] = \frac{1}{\alpha} h_\alpha[n] = \sum_{k=0}^{N-1} h[k] \cdot \frac{1}{\alpha} K_\alpha(n, k)$$

where, $\alpha$ is the sampling constant, $K_\alpha(n,k)$ is the sampling kernel, and h[n] is the model filter response.

2. The digital filter of claim 1, wherein the sampling constant is determined by following equation, $$\alpha_{opt} = \frac{2\pi}{\omega_p + \omega_s + \sqrt{2\pi(\omega_s - \omega_p)}}$$

where, $\omega_p$ is frequency of pass band, and $\omega_s$ is frequency of stop band.

3. The digital filter having improved attenuation characteristics comprising:
   a delay section for delaying an input signal based on an sampling constant; and
   a filtering section for filtering an output signal of the delay section,
   wherein, response of the delay section and the filtering section is set so that an upsampling of filter response for the filtering section is performed by a sampling kernel scaled by a sampling constant,
   and wherein the sampling kernel is expressed as following equation using a sinc function, $$K_\alpha(n, k) = \mathrm{sinc}\left(\frac{n}{\alpha} - k\right)$$

where, $\alpha$ is the sampling constant, and $k_\alpha(n,k)$ is the sampling kernel.

4. The digital filter of claim 3, wherein the sampling constant is determined by following equation, $$\alpha_{opt} = \frac{2\pi}{\omega_p + \omega_s + \sqrt{2\pi(\omega_s - \omega_p)}}$$

where, $\omega_p$ is frequency of pass band, and $\omega_s$ is frequency of stop band.

5. A frequency reconfigurable digital filter comprising:
   a sampling kernel storage section configured to store a sampling kernel that can be used for performing upsampling of a model filter response scaled by a sampling constants;
   an upsampling section configured for upsampling the model filter response by multiplying a model filter function by the stored sampling kernel;

a Multi image generation section configured for generating response of Multi images which are repeatedly formed with a constant period in the frequency domain, the response of Multi images corresponding to pass bands based on a response of the upsampled model filter;

a complementary conversion section configured to generate response of Multi complementary images repeatedly formed with constant period in frequency domain, the Multi complementary images being generated in frequencies where the Multi images are not generated, having the same characteristic as the Multi images; and an image response operation section configured to obtain response of an image corresponding to a selected band among the Multi complementary images and the Multi images, wherein the sampling kernel $k_{\alpha,L}(n,k)$ includes the sampling constant and Multi image number as variable, and wherein, the sampling kernel $k_{\alpha,L}(n,k)$ is expressed as following Equation, $$K_{\alpha,L}(n,k) = (2L+1)\mathrm{sinc}\left(\left(\frac{n}{\alpha} - k\right)(2L+1)\right),$$

where L is the Multi image number, and $\alpha$ is the sampling constant.

6. The digital filter of claim 5, further comprising:
a filter response operation section configured to generate the response of the filter by summing the responses of each of the image corresponding to the selected band in case that the selected band corresponds to plural Multi images or Multi complementary images.

7. The digital filter of claim 5, wherein the upsampling of model filter response and generation of Multi images using the sampling kernel is performed by following equation, $$h_{(a),L}[n] = \frac{1}{2\pi}\sum_{k=0}^{N-1} h[k] \int_{-\frac{(2L+1)\pi}{a}}^{\frac{(2L+1)\pi}{a}} e^{j(n-ak)w'} dw'$$
$$= \sum_{k=0}^{N-1} h[k] \cdot \frac{1}{\alpha} K_{\alpha,L}(n,k),$$

where $\alpha$ is the sampling constant, h[n] is the response of the model filter, L is the Multi image number, $K_{\alpha,L}(n,k)$ is the sampling kernel, and the Multi image number corresponds to the L.

8. The digital filter of claim 5, wherein the complementary conversion section generates plural Multi complementary images by delaying the response for generating the Multi images by $$z^{-\frac{(N-1)}{2}}$$

in z domain, and N is length of the model filter.

9. A frequency reconfigurable filtering method comprising:

operating a response of a Multi images which are formed repeatedly with a constant period in frequency domain, the response of the Multi images being operated by applying a sampling kernel scaled by a sampling constant;

operating a response of a Multi complementary images which are formed repeatedly with a constant period in frequency domain the Multi complementary images being generated in frequencies where the Multi images are not generated, and having same characteristics with the Multi images; and operating response of an image corresponding to a selected band among the Multi complementary images and the Multi images, wherein the sampling kernel includes the sampling constant and Multi image number is variable, and wherein, the sampling kernel $K_{\alpha,L}(n,k)$ is expressed as following Equation, $$K_{\alpha,L}(n,k) = (2L+1)\mathrm{sinc}\left(\left(\frac{n}{\alpha} - k\right)(2L+1)\right),$$

where L is the Multi image number, and $\alpha$ is the sampling constant.

10. The frequency reconfigurable filtering method of claim 9, wherein the conversion response for generating the Multi complementary images is expressed as following Equation, $$h_{(a),L}[n] = \frac{1}{2\pi}\sum_{k=0}^{N-1} h[k] \int_{-\frac{(2L+1)\pi}{a}}^{\frac{(2L+1)\pi}{a}} e^{j(n-ak)w'} dw'$$
$$= \sum_{k=0}^{N-1} h[k] \cdot \frac{1}{\alpha} K_{\alpha,L}(n,k),$$

here where $\alpha$ is the sampling constant, h[n] is the response of the model filter, L is the Multi image number, $K_{\alpha,L}(n,k)$ is the sampling kernel, and the Multi image number corresponds to the L.

11. The frequency reconfigurable filtering method of claim 9, further comprising:
generating a response of the filter by summing response of each of the images corresponding to the selected bands in case that the selected bands correspond to plural Multi images or Multi complementary images.

12. The frequency reconfigurable filtering method of claim 11, wherein the step of operating the response of the Multi complementary images includes delaying the response for generating the Multi image by $$z^{-\frac{(N-1)}{2}}$$

in z domain, and N is length of the model filter.

* * * * *